(12) United States Patent
Lysen

(10) Patent No.: US 7,723,668 B2
(45) Date of Patent: *May 25, 2010

(54) PHOTODETECTOR ARRANGEMENT, MEASUREMENT ARRANGEMENT WITH A PHOTODETECTOR ARRANGEMENT AND PROCESS FOR OPERATING A MEASUREMENT ARRANGEMENT

(75) Inventor: Heinrich Lysen, Garching (DE)

(73) Assignee: Prueftechnik Dieter Busch AG, Ismaning (DE)

( * ) Notice: Subject to any disclaimer, the term of this patent is extended or adjusted under 35 U.S.C. 154(b) by 119 days.

This patent is subject to a terminal disclaimer.

(21) Appl. No.: 11/690,363

(22) Filed: Mar. 23, 2007

(65) Prior Publication Data

US 2007/0222017 A1    Sep. 27, 2007

(30) Foreign Application Priority Data

Mar. 23, 2006    (DE) .................. 10 2006 013 461

(51) Int. Cl.
G01D 5/36    (2006.01)
H01L 31/06   (2006.01)
H01L 27/14   (2006.01)

(52) U.S. Cl. .................. 250/214.1; 250/206.1; 257/458

(58) Field of Classification Search .............. 250/214.1, 250/206.1, 206.2; 257/458, 459, 466
See application file for complete search history.

(56) References Cited

U.S. PATENT DOCUMENTS

| | | | |
|---|---|---|---|
| 3,887,936 A | 6/1975 | Shannon et al. | |
| 4,469,945 A * | 9/1984 | Hoeberechts et al. | .. 250/370.01 |
| 4,749,849 A * | 6/1988 | Hoeberechts et al. | .... 250/201.5 |
| 4,810,871 A * | 3/1989 | Opheij | .......... 250/206.1 |
| 4,874,939 A | 10/1989 | Nishimoto et al. | |
| 4,887,140 A | 12/1989 | Wang | |
| 5,105,249 A * | 4/1992 | Bierhoff et al. | .......... 257/462 |
| 5,324,929 A | 6/1994 | Yamada et al. | |
| 5,448,054 A * | 9/1995 | Massey | .......... 250/206.1 |
| 6,593,636 B1 | 7/2003 | Bui et al. | |
| 6,815,790 B2 | 11/2004 | Bui et al. | |

(Continued)

FOREIGN PATENT DOCUMENTS

EP    0 206 363 A1    12/1986

(Continued)

OTHER PUBLICATIONS

Joe Wagner, Large Area PSD Series, http:www-cdr.stanford.edu/MADEFAST/catalogs/hamamatsu/psd-principle.html, Feb. 16, 2007, pp. 1-3.

(Continued)

*Primary Examiner*—John R Lee
(74) *Attorney, Agent, or Firm*—Roberts Mlotkowski Safran & Cole, P.C.; David S. Safran

(57) ABSTRACT

A photodetector arrangement has a semiconductor body with a substrate, and first, second and third layers. The first layer is located at the first main surface of the semiconductor body which is suited for reception of incident photon radiation which is to be detected. The second layer is located at the second main surface of the semiconductor body which is at a distance to the first main surface. The third layer is located between the substrate and the second layer.

15 Claims, 3 Drawing Sheets

U.S. PATENT DOCUMENTS

| | | | |
|---|---|---|---|
| 2001/0001499 A1* | 5/2001 | Takeshita et al. | 257/431 |
| 2007/0222016 A1* | 9/2007 | Lysen | 257/459 |
| 2007/0222017 A1* | 9/2007 | Lysen | 257/465 |

FOREIGN PATENT DOCUMENTS

| | | |
|---|---|---|
| EP | 0 251 402 A2 | 1/1988 |
| EP | 0 400 753 A1 | 12/1990 |
| EP | 0 513 444 A1 | 11/1992 |
| EP | 1 113 504 A1 | 7/2001 |
| GB | 2 102 201 A | 1/1983 |
| JP | 4-10581 A | 1/1992 |
| JP | 10-12856 A | 1/1998 |
| JP | 10-290013 A | 10/1998 |
| WO | 84/04960 A1 | 12/1984 |

OTHER PUBLICATIONS

Y. Morikawa et al., A Small-Distortion Two-Dimensional Position-Sensitive Detector (PSD) With On-Chip Mosfet Switches; Sensors and Actuators A, Elsevier Sequoai S.A., Lausanne, CH; vol. A34, No. 2, Aug. 1, 1992; pp. 123-129; XP000297724; ISSN: 0924-4247.

Hanns-Peter Siebert, Optoelektronische Positionsdetektoren PSD: Völlig Aufgelöst; Elektronik, Weka, Fachzeitschriftenverlag, Poing, DE; vol. 13, Jun. 29, 1984; pp. 84-88; XP002032544; ISSN: 0013-5658.

European Search Report for European Application No. 07 00 3347 Dated May 2, 2008.

European Search Report for European Application No. 07 003348 Dated May 8, 2008.

* cited by examiner

PHOTODETECTOR ARRANGEMENT, MEASUREMENT ARRANGEMENT WITH A PHOTODETECTOR ARRANGEMENT AND PROCESS FOR OPERATING A MEASUREMENT ARRANGEMENT

BACKGROUND OF THE INVENTION

1. Field of the Invention

This invention relates to a photodetector arrangement, a measurement arrangement with a photodetector arrangement, a process for operating a measurement arrangement, and a process for producing a photodetector arrangement.

2. Description of Related Art

Photodetector arrangements are used, for example, to determine the position of the incidence site of a light beam. PN diodes and PIN diodes are conventionally used here. Examples of known position detecting devices can found in U.S. Pat. Nos. 4,874,939; 4,887,140; and 6,815,790 as well as in International Patent Application Publication WO 84/04960.

SUMMARY OF THE INVENTION

In accordance with one aspect of the invention, a photodetector arrangement is formed by a semiconductor body, comprising a substrate; a first layer at a first main surface of the semiconductor body which is suited for reception of incident photon radiation which is to be detected; a second layer with a first conduction type at the second main surface of the semiconductor body which is at a distance from the first main surface; and a third layer which has a second conduction type which is opposite the first conduction type and is located between the substrate and the second layer.

In accordance with another aspect of the invention, a method for operating a measurement arrangement with a photodetector arrangement comprises irradiation of the photodetector arrangement with photon radiation; producing electron hole pairs in a semiconductor body of the photodetector arrangement as a result of photon radiation; determining the detector current which flows through a first layer which is located at the first main surface of the semiconductor body, or through a second layer which is located at the second main surface of the semiconductor body; providing a compensation current with a value which has a given ratio to the value of the detector current; and supplying the compensation current to a third layer which is located between the first and second layers of the semiconductor body.

In accordance with yet another aspect of the invention, a process for producing a photodetector arrangement comprises preparing a semiconductor body with a substrate; executing a first doping step on a first main surface of the semiconductor body; executing a second doping step on a second main surface of the semiconductor body which is at a distance from the first main surface; executing a third doping step on the second main surface; executing a temperature process for diffusion of dopants for producing a first layer at the first main surface, a second layer at the second main surface and a third layer between the substrate and the second layer; forming a measurement terminal for making electrical contact to the second layer and a compensation terminal for making electrical contact to the third layer; and forming a total current terminal for making electrical contact to the first layer.

The invention is explained below with reference to the accompanying drawings.

DETAILED DESCRIPTION OF THE INVENTION

Layers, arrangements and components of the same function and action bear the same reference numbers. To the extent that layers, arrangements or components correspond in their operation, their description is not repeated.

Figure 1:
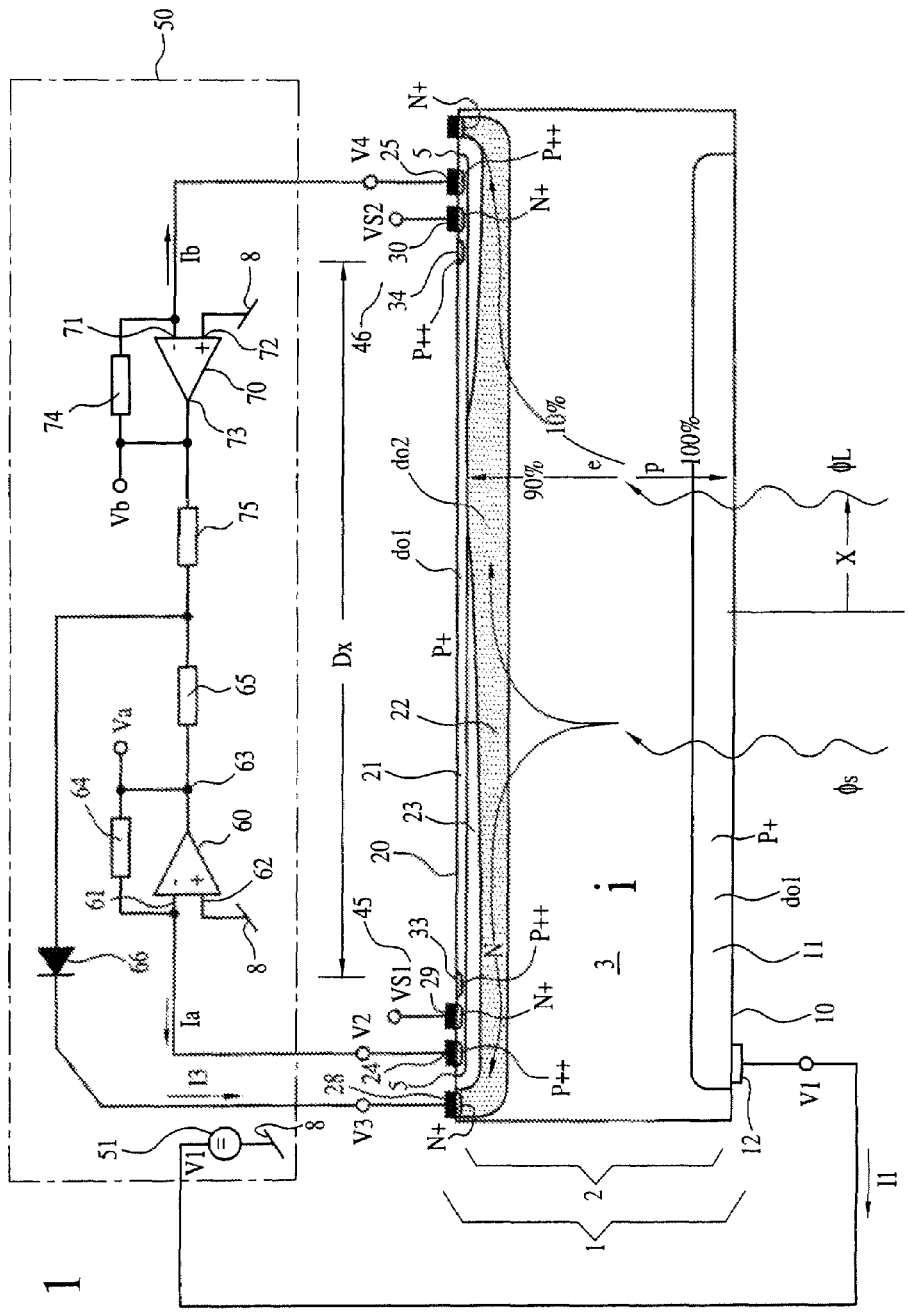
FIG. 1 shows an embodiment of a photodetector arrangement in a cross section with a circuit arrangement according to the suggested principle.

FIG. 1 shows a sample embodiment of a photodetector arrangement 1 according to the suggested principle of the invention in cross section together with a circuit arrangement 50. The photodetector arrangement 1 has a semiconductor body 2 with a substrate 3, a first main surface 10 and a second main surface 20 which is located at a distance from the first main surface 10. A first layer 11 is located at the first main surface 10 of the semiconductor body 2. On the first layer 11, there is a total current terminal 12. The semiconductor body 2 also has a second layer 21 which is located at a second main surface 20 of the semiconductor body 2. Moreover, the semiconductor body 2 comprises a third layer 22 which is located between the second layer 21 and the substrate 3. There are a first and a second measurement terminal 24, 25 on the second layer 21 which are each located at a distance from one another on the peripheral edge 5 of the second layer 21. The third layer 22 is connected to the second main surface 20 on the edges of the illustrated extract of the semiconductor body 2. On it, there is a compensation terminal 28. The semiconductor body 2 has a first and a second transistor 45, 46 which couple the second layer 21 to the first and the second measurement terminals 24, 25. The first transistor 45 comprises a first control terminal 29 and a first drain region 33. Accordingly, the second transistor 46 comprises a second control terminal 30 and a second drain region 34. The first and second layers 11, 21 are made as highly P or alternatively as P doped layers. The third layer 22 is made as an N doped layer and the substrate 3 is made as an intrinsically conducting semiconductor, the material of which is silicon.

The circuit arrangement 50 has a voltage source 51 which is connected to the total current terminal 12. Furthermore, the circuit arrangement 50 comprises a first amplifier 60. A first input 61 of the first amplifier 60 is connected to the first measurement terminal 24 and via a first feedback impedance 64 to an output 63 of the first amplifier 60. Accordingly, the circuit arrangement 50 has a second amplifier 70. A first input 71 of the second amplifier 70 is connected to the second measurement terminal 25 and via a second feedback impedance 74 to an output 73 of the second amplifier 70. The second input 62 of the first amplifier 60 and the second input 72 of the second amplifier 70 are connected to the reference potential terminal 8. The output 63 of the first amplifier 60 and the output 73 of the second amplifier 70 are connected via first and second impedances 65, 75 to a node which is coupled by means of a diode 66 to the compensation terminal 28.

The first layer 11 is contacted via the total current terminal 12, the second layer 21 is contacted via the first and second measurement terminals 24, 25 and the third layer 22 is contacted via the compensation terminal 28. The first potential V1 is made available at the total current terminal 12, a second potential V2 at the first measurement terminal 24, a fourth potential V4 at the second measurement terminal 25, and a third potential V3 at the compensation terminal 28. The second potential V2 is set to be smaller than the third potential V3 so that a first space charge zone 23 is formed between the second and the third layers 21, 22. The first potential V1 is set to be smaller than the third potential V3 so that the substrate 3 between the first layer 11 and the third layer 22 is likewise formed as a space charge zone.

Light radiation ΦL which is incident on the photodetector arrangement 1 is absorbed within the semiconductor body 2 and produces electron hole pairs. Electrons e and holes p which are generated in the substrate 3 between the first layer 11 and the third layer 22 contribute to a detector current I1 which flows through the total current terminal 12. The value of the detector current I1 corresponds to the total of the values of the first measurement current Ia which flows through the first measurement terminal 24, the second measurement current Ib which flows through the second measurement terminal 25, and a compensation current I3 which flows through the compensation terminal 28.

The voltage source 51 makes available the first potential V1 with a value which is negative relative to the reference potential on the reference potential terminal 8 so that a space charge zone is formed between the first layer 11 and the third layer 22. The first and the second amplifier 60, 70 are used to convert the first and the second measurement currents Ia, Ib into first and second output voltages Va, Vb which are made available at the outputs 63, 73 of the two amplifiers 60, 70. The first input 61 is inverting relative to the second input 62 of the first amplifier 60; accordingly, the first input 71 of the second amplifier 70 is switched to be inverting relative to the second input 72. When the light beam ΦL is incident on the photodetector arrangement 1 nearer the first measurement terminal 24 than the second measurement terminal 25, the first measurement current Ia has a higher value than the second measurement current Ib. The x coordinate of the position of the incidence of the light beam on the photodetector arrangement 1 can be determined roughly with the following equation:

$$x = \frac{Dx}{2} \frac{Ia - Ib}{Ia + Ib} = \frac{Dx}{2} \frac{Va - Vb}{Va + Vb},$$

Ia and Ib being the first and the second measurement currents, Va and Vb being the first and the second output voltages and Dx being the distance between the first and the measurement terminal 24, 25. Both the light beam ΦL and the scattered radiation φs can produce electron hole pairs. For example, scattered radiation φs with a power of 0.01 mW is shown which leads to a current on the order of 1 μA in the third layer 22 to the compensation terminal 28 located outside. A light beam ΦL with an energy of, for example, 0.1 mW and a wavelength of, for example, 635 nm is likewise incident on the photodetector arrangement 1 and produces electron hole pairs. The ratio of the compensation current I3 to the sum of the first and second measurement current Ia, Ib is set such that the compensation current I3 corresponds to the portion produced by the scattered radiation φs in the detector current I1. The first and second feedback impedances 64, 74 and the first and the second impedances 65, 75 can be made resistances. The two feedback impedances 64, 74 can, for example, have a resistance value of 30 kOhm and the two impedances 65, 75 can have a resistance value of 300 kOhm so that the compensation current I3 is roughly 10% of the value of the sum of the first and second measurement current Ia, Ib. Thus, the detector current portion produced by the scattered radiation φs drains via the compensation terminal 28. For this purpose, the compensation current I3 from the output 63 of the first amplifier 60 flows via the first impedance 65 and from the output 73 of the second amplifier 70 via the second impedance 75 to the diode 66, and thus, to the compensation terminal 28. The third layer 22 is doped lower than the second layer 21 so that the main portion of the detector current I1 flows through the third layer 22 to the second layer 21.

The first and second control terminals 29, 30 are supplied with the first and second control voltages VS1, VS2. If the first and the second transistors 45, 46 are switched into the blocking state by means of the first and second control potentials VS1, VS2, neither the first measurement current Ia nor the second measurement current Ib flows. Thus, the x coordinate of the incidence of the light beam is not detected in this operating state. However, if the first and second transistors 45, 46 are switched in conduction by means of the first and second control potentials VS1, VS2, the first and the second measurement currents Ia, Ib flow.

Thus, advantageously, the position of incidence of the light beam ΦL can be determined from the level of the first and second measurement currents Ia, Ib. Advantageously, the effect of the scattered radiation φs can be reduced by means of the compensation current I3.

In one alternative embodiment, the photodetector arrangement 50 has a second compensation terminal which is connected to the third layer 22 and is located on a peripheral edge in a region away from the first compensation terminal 28. The terminal of the diode 66 can be connected directly to the first and the second compensation terminal or can be coupled via a circuit for dividing the compensation current I3.

Alternatively the first and the second drain region 33, 34 can be omitted.

In one alternative embodiment, the first and the second transistor 45, 46 can be omitted. The photodetector arrangement 1 in this alternative embodiment has a first and a second measurement terminal 24, 26, but not the first and the second control terminal 29, 30 and the first and second drain region 33, 34.

In one alternative embodiment, the first layer 11 and the second layer 21 are made as an N doped and the third layer 22 is made as a P doped region.

Figure 2:
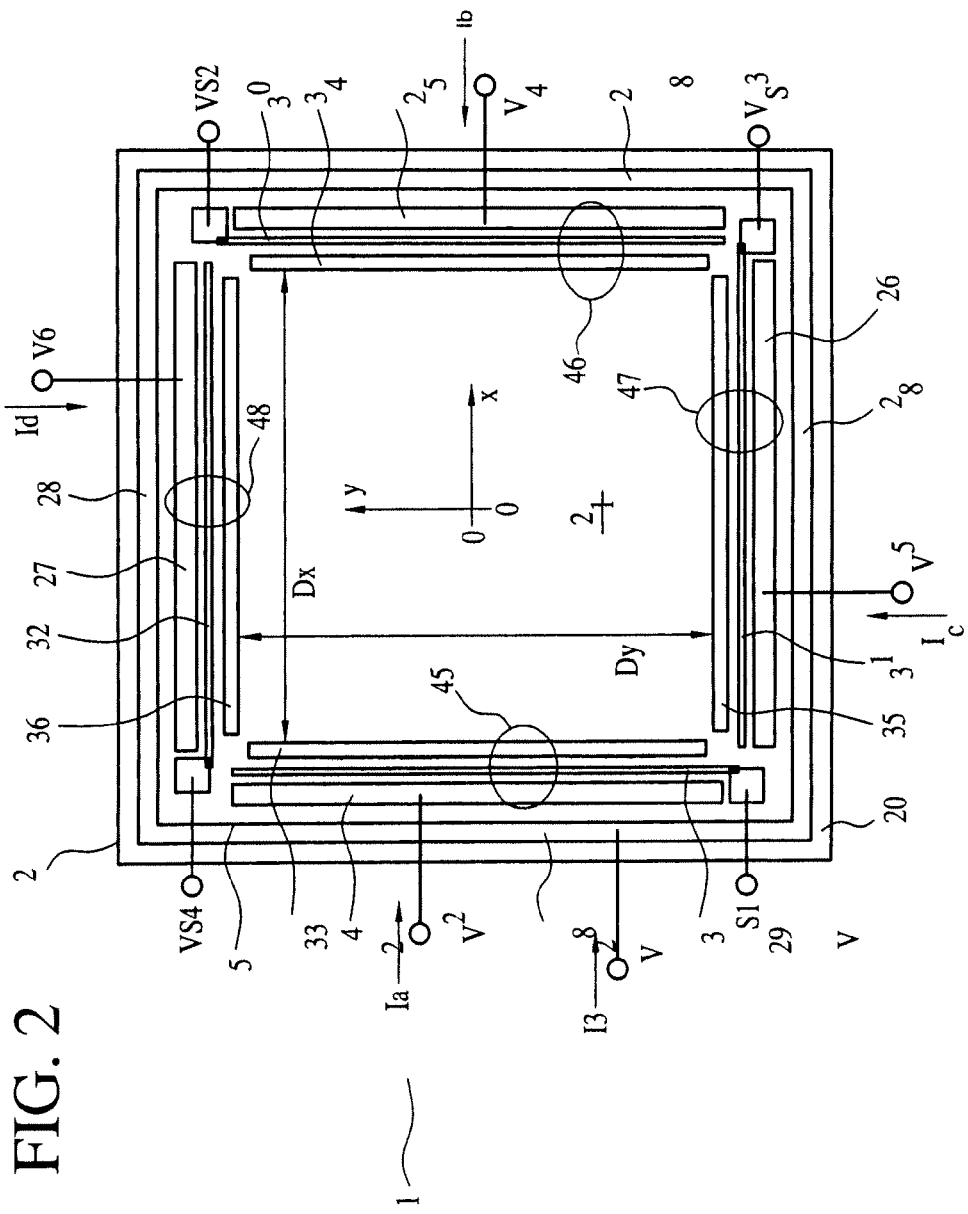
FIG. 2 is a top view of the embodiment of the photodetector arrangement shown in FIG. 1

FIG. 2 shows the embodiment of the photodetector arrangement 1 of FIG. 1 in a top view of the second main surface 20. The second main surface 20 has a second layer 21 which can be made rectangular, especially square. The first measurement terminal 24 is made as a strip along the edge 5 of the second layer 21. Accordingly also second, third and fourth measurement terminals 25, 26, 27 are each provided as strips on the edge 5 of the second layer 21. The four measurement terminals 24 to 27 are located on the edges of a rectangle. The first and second measurement terminals 24, 25 are located spaced apart from one another. Accordingly, the third and the fourth measurement terminals 26, 27 are likewise located spaced apart from one another. An imaginary connecting line from the first measurement terminal 24 to the second measurement terminal 25 crosses an imaginary connecting line from the third measurement terminal 26 to the fourth measurement terminal 27. Electrical contact is made with the four measurement terminals 24 to 27 from the outside so that a second, fourth, fifth and sixth potential V2, V4, V5, V6 can be tapped off at them. Around the second layer 21, and thus, the four measurement terminals 24 to 27, there is a strip-shaped compensation terminal 28 with which electrical contact is made from the outside for supplying a third potential V3. The photodetector arrangement 1 has four transistors 45 to 48. The first transistor 45 comprises the first control terminal 29 and the first drain region 33. The second, the third and the fourth transistor 46, 47, 48 are made accordingly.

The compensation current I3 is supplied to the photodetector arrangement 1 via the compensation terminal I3. If the first and the second transistors 45, 46 are switched in a conduction state, by means of the first and second measurement currents Ia, Ib, the x coordinate of the position of incidence of the light beam can be determined. The y coordinate can be determined as soon as the first and second transistors 45, 46 are switched to the blocking operation state and the third and fourth transistors 47, 48 are switched in the conducting state and the value of the third measurement current Ic and the value of the fourth measurement current Id are determined.

Alternatively, the four drain regions 33 to 36 in the semiconductor body 2 can be conductively connected to one another so that they are made as a strip.

Alternatively, the four drain regions 33 to 36 can be omitted.

In another embodiment, the four transistors 45 to 48, and thus, the four control terminals 29 to 32 and the four drain regions 33 to 36 can be omitted. The x and y coordinates can thus be determined at the same time.

In an alternative embodiment, the photodetector arrangement 1 has a second, third and fourth compensation terminal which are coupled to the third layer 22, and on the edge, are located on the photodetector arrangement 1 in regions remote from one another.

Figure 3:
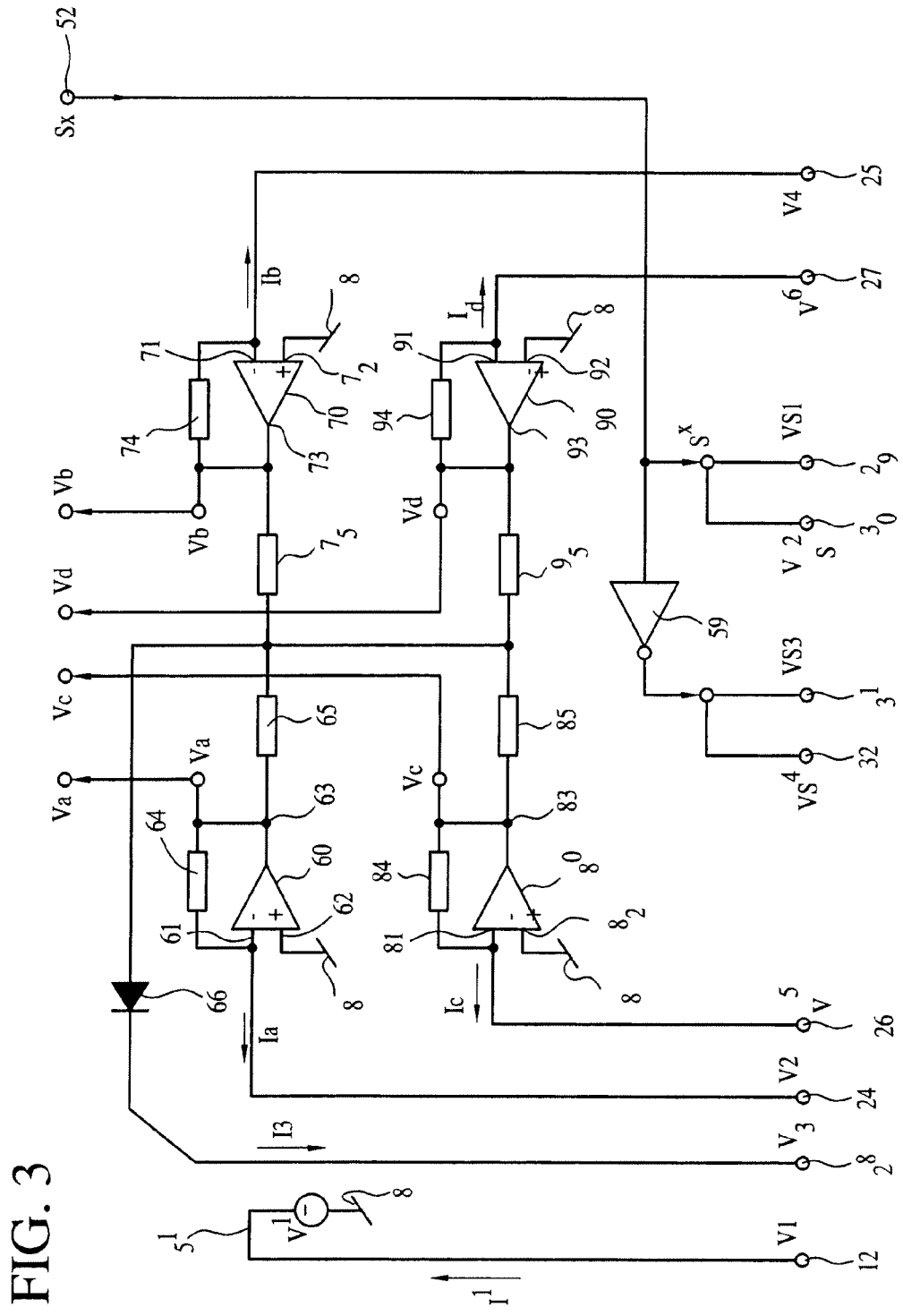
FIG. 3 shows another embodiment of a circuit arrangement.

FIG. 3 shows an embodiment of a circuit arrangement 50 according to the suggested principle which constitutes a development of the circuit arrangement as shown in FIG. 1. In addition to the circuit arrangement 50 as shown in FIG. 1, the circuit arrangement 50 as shown in FIG. 3 has an inverter 59 which is connected on one input to the input 52 of the circuit arrangement 50. The first and second control terminals 29, 30 are connected to the input of the inverter 59 and the third and fourth control terminals 31, 32 are connected to the output of the inverter 59. Furthermore, the circuit arrangement 50 has a third and fourth amplifier 80, 90 which are connected on the input side to the third and fourth measurement terminals 26, 27, respectively, and at their output make available a third and fourth output signal Vc, Vd, respectively.

At the input 52 of the circuit arrangement 50, a clock signal Sx is supplied. By means of the inverter 59 the first and second transistors 45, 46 are switched in the blocking state and in the conducting state in alternation with the third and fourth transistors 47, 48. The y coordinate can be determined approximately according to the following equation:

$$y = \frac{Dy}{2} \frac{Ic - Id}{Ic + Id} = \frac{Dy}{2} \frac{Vc - Vd}{Vc + Vd},$$

Ic being the third and Id being the fourth measurement current, Vc being the third and Vd being the fourth output voltage and Dy being the distance between the third and the fourth drain region 26, 27.

In an alternative embodiment, the circuit arrangement has a current division circuit which couples the diode 66 relative to the first, second, third and fourth compensation terminals. The current division circuit can comprise four resistors which are connected on the first terminal to the diode 66 and on the second terminal to a respective one of the four compensation terminals. The resistors can have roughly the same value so that the value of the current which is flowing at the time through one of the four compensation terminals can be roughly the same.

In one embodiment, a photodetector arrangement comprises a semiconductor body with a substrate, a first, a second and a third layer. The first layer is located below the first main surface and the second layer is located below the second main surface of the semiconductor body. The second main surface of the semiconductor body is opposite the first main surface. The third layer is located between the substrate and the second layer. The second layer has a first conduction type and the third layer has a second conduction type which differs from the first conduction type. The semiconductor body is suited for receiving incident light radiation which is to be detected. The light radiation produces electron hole pairs which contribute mainly to electrical conductivity in the space charge zones. A detector current flows through the first layer and the substrate. Part of the detector current flows via the second layer and another part via the third layer. In addition to the light radiation to be detected, scattered radiation can be incident on the semiconductor body.

Advantageously, the third layer is designed to extract the current produced by the scattered radiation. On the second layer a measurement current can be tapped off which is only slightly dependent on the scattered radiation. Advantageously, a reduction of the influence of the scattered radiation on the photodetector arrangement is thus enabled.

In one embodiment, the substrate is made as an intrinsic semiconductor. Therefore, a low voltage between the first and the third layer can be sufficient to clear movable charge carriers from the substrate and to make available a space charge zone.

The first layer can be made as a translucent metal layer, especially a thin gold layer, or as a translucent semiconductor layer, especially as an indium-tin oxide layer. In an alternative embodiment, the first layer has the material of the substrate and is made as a semiconducting layer of the first conduction type.

The semiconductor body can comprise a semiconductor material, such as gallium arsenide, indium-gallium arsenide, indium phosphite, germanium, mercury-cadmium telluride. In another embodiment, the semiconductor body is made of silicon.

The first conduction type can be made as a P or highly P doped semiconductor material and the second conduction type as an N or highly N doped semiconductor material. Alternatively, the first conduction type can be implemented as an N or highly N doped semiconductor material and the second conduction type as a P or highly P doped semiconductor material.

The second layer can be made with high resistance. The second layer can, for example, have a sheet resistance between 1 and 9 kOhm per square. The second layer preferably has a sheet resistance of roughly 5 kOhm per square. In one embodiment, the third layer has a higher sheet resistance than the second layer. The third layer, for example, can have a sheet resistance between 10 and 100 kOhm per square. If the sheet resistance of the third layer is higher than the sheet resistance of the second layer, a smaller portion of the detector current is dissipated via the third layer compared to the second layer. Preferably, the third layer has a sheet resistance of roughly 30 kOhm per square.

In one development, the photodetector arrangement has a first measurement terminal which is coupled to the second layer. The first measurement terminal can be made for making electrical contact to the second layer from outside the semiconductor body. In a development, the photodetector arrangement has a second measurement terminal which is coupled to the second layer and is likewise designed for making electrical contact to the second layer from outside. The first and the second measurement terminals can be located near the peripheral edge of the second layer. The first and the second measurement terminals are arranged at a distance from one another on the second main surface.

In one embodiment, the photodetector arrangement has a third and fourth measurement terminal. They are coupled to the second layer and are likewise made for making electrical contact with the second layer. They are located near the edge of the second layer on two other regions which are remote from one another. An imaginary connecting line between the first and second measurement terminal can cross an imaginary connecting line between the third and the fourth measurement terminal. The two connecting lines can cross at an angle of roughly 90 degrees. The two connecting lines are preferably made as straight lines.

In one embodiment, a measurement arrangement can have the photodetector arrangement and a circuit arrangement. The circuit arrangement is coupled to the total current terminal of the first layer at which the first potential is made available. Furthermore, the circuit arrangement is coupled to the first measurement terminal of the second layer at which a second potential can be tapped off, and to a compensation terminal of the third layer at which a third potential can be tapped off.

The first and third potentials are set such that a PN junction between the first and third layers is polarized in the blocking direction. Thus, the substrate located between the first and third layer can be largely cleared of free charge carriers so that photon radiation which has been absorbed in the substrate produces a measurable increase of the charge carrier concentration in the substrate, and thus, of the detector current. The second and third potential can be set such that a PN junction between the second and the third layer is also switched in the blocking direction.

In one development, the circuit arrangement has a first current measurement circuit for determining the current flowing through the first measurement terminal. The first current measurement circuit can be implemented as a current/voltage converter which is connected on the input side to the first measurement terminal. In one embodiment the current/voltage converter comprises a first amplifier which is connected at a first input to the first measurement terminal, at a second input to the reference potential terminal, and at the output via a first feedback impedance to the first input. At the output of the first amplifier a first output voltage is made available.

In one development, the circuit arrangement has a second, a third and a fourth current measurement circuit which is connected to the second, the third and the fourth measurement terminal, respectively. In one embodiment, the respective current measurement circuit is made as a current/voltage converter.

In a development, the circuit arrangement comprises a current source which is connected to a compensation terminal which is coupled to the third layer and is used to make available a compensation current. The current source is designed such that the compensation current has a definable ratio relative to the sum of the currents flowing through the measurement terminals. The ratio can be set in a design phase. In one embodiment, the current source has a first impedance and a diode which is switched between the output of the first current measurement circuit and the compensation terminal.

In an alternative embodiment, the photodetector arrangement has a second, third and fourth compensation terminal which are coupled to the third layer. The four compensation terminals are located on the edge side on the photodetector arrangement. The circuit arrangement can have a second, third and fourth current source which are coupled to the second, third or fourth compensation terminal. The value of the current which is flowing through one of the compensation terminals can be roughly the same. Alternatively, different current values are injected.

The measurement arrangement can be used to determine the position of the incidence site of a light beam on the photodetector arrangement. It can be used to determine the position along one coordinate. It can be used alternately for determining the x and the y coordinate of the position of the incidence site. The measurement arrangement can be used to ascertain alignment errors of successive shafts.

In one embodiment, a method for operation of a measurement arrangement with a photodetector arrangement comprises: The photodetector arrangement is irradiated with a light beam. Electron hole pairs in the semiconductor body of the photodetector arrangement are generated by means of the light beam. The free electrons and the free holes are dissipated as a detector current. The detector current is determined. A compensation current is supplied to the photodetector arrangement with a value which has a definable ratio to the value of the detector current.

Thus, a compensation current is advantageously supplied to the photodetector arrangement and corresponds roughly to the portion of the detector current produced by the scattered light. A measurement current is tapped off at the photodetector arrangement which has the value of the difference between the detector current and the compensation current and is advantageously roughly independent of the scattered radiation.

In one embodiment, the detector current flows through a first layer which is located at the first main surface of the semiconductor body. Preferably, the detector current flows through a second layer which is located at the second main surface of the semiconductor body. The compensation current can be advantageously supplied to a third layer which is located in the semiconductor body between the second layer and the substrate.

In one embodiment, the process for producing a photodetector arrangement comprises the following steps: A semiconductor body with a substrate is prepared. Dopant atoms are added to the semiconductor body on the first main surface of the semiconductor body. Dopant atoms are likewise added to the semiconductor body on the second main surface of the semiconductor body. The second main surface is opposite the first main surface. Moreover, other dopants are added to the semiconductor body on the second main surface. A temperature process is carried out for diffusion of the dopants into the semiconductor body. By means of the doping steps and the temperature process, a first layer is produced at the first main surface, a second layer is produced at the second main surface, and a third layer is produced between the substrate and the second layer. The first, second and third layers are provided with terminals for making electrical contacts from the outside.

In one embodiment, the second layer has a first conduction type and the third layer has a second conduction type. The second conduction type is opposite the first conduction type. The first layer can preferably have the first conduction type.

In an embodiment, the doping steps take place as ion implantation steps. In one development, the temperature process is carried out together with an oxidation step. The temperature process can be a high-temperature process.

What is claimed is:

1. Photodetector arrangement, having a semiconductor body which comprises
    a semiconductor substrate,
    a first layer at a first main surface of the semiconductor substrate, said first layer being adapted for reception of an incident photon radiation which is to be detected,
    a second layer which is a semiconductor layer of a first conduction type at a second main surface of the semiconductor substrate which is on an opposite side of the substrate from the first main surface,
    a third layer which is a semiconductor layer of a second conduction type which is opposite the first conduction type and is located between the substrate and the second layer,
    a first measurement terminal which is located on the second layer at the second main surface and is adapted for making electrical contact to the second layer from outside the photodetector arrangement,
    a second measurement terminal which is adapted for making electrical contact to the second layer from outside the photodetector arrangement and which is located on the second layer at the second main surface on an edge area in a region which is away from the first measurement terminal,
    wherein an x-coordinate of the position of incidence of a light beam on the photodetector arrangement is obtainable from the magnitude of a first measurement current flowing through said first measurement terminal and of a second measurement current flowing through said second measurement terminal.

2. Photodetector arrangement as claimed in claim 1, in which the substrate is made of an intrinsic semiconductor material.

3. Photodetector arrangement as claimed in claim 1, in which the first layer is of the first conduction type.

4. Photodetector arrangement as claimed in claim 1, in which the second layer has a high resistance.

5. Photodetector arrangement as claimed in claim 4, in which the second layer has a sheet resistance between 1 and 9 kOhm/square.

6. Photodetector arrangement as claimed in claim 1, in which the third layer has a higher sheet resistance than the second layer.

7. Photodetector arrangement as claimed in claim 6, in which the third layer has a sheet resistance between 10 and 100 kOhm/square.

8. Photodetector arrangement as claimed in claim 1, further comprising a third and a fourth measurement terminal which are adapted for making electrical contacts to the second layer and which are located on the second layer at the second main surface, each of the third and fourth measurement terminals being on the edge area in two other regions at a distance from one another such that an imaginary connecting line from the third to the fourth measurement terminal and an imaginary connecting line from the first to the second measurement terminal cross each other.

9. Photodetector arrangement as claimed in claim 1, further comprising a measurement circuit arrangement which is connected to
    a total current terminal which is located on the first layer and at which a first potential can be tapped off,
    the first measurement terminal of the second layer at which a second potential can be tapped off, and
    a compensation terminal which is located on the third layer and at which a third potential can be tapped off.

10. Photodetector arrangement as claimed in claim 9, in which
    the first and the third potentials are set such that a PN junction between the first and the third layer is polarized in a blocking direction, and
    the second and the third potential are set such that a PN junction between the second and the third layer is polarized in the blocking direction.

11. Photodetector arrangement as claimed in claim 9, in which the measuring circuit arrangement has a first amplifier which comprises
    a first input which is coupled to the first measurement terminal,
    a second input which is coupled to a reference potential terminal, and
    an output which is coupled via a first feedback impedance to the first input and at which a first output voltage can be tapped off.

12. Photodetector arrangement as claimed in claim 1, in which the measuring circuit arrangement has a first amplifier which comprises
    a first input which is coupled to the first measurement terminal,
    a second input which is coupled to a reference potential terminal, and
    an output which is coupled via a first feedback impedance to the first input and at which a first output voltage can be tapped off,
and a second amplifier which comprises
    a first input which is coupled to the second measurement terminal,
    a second input which is coupled to the reference potential terminal, and
    an output which is coupled via a second feedback impedance to the first input of the second amplifier and at which a second output voltage can be tapped off.

13. Photodetector arrangement as claimed in claim 8, further comprising a measuring circuit arrangement that has a first amplifier which comprises:
    a first input which is coupled to the first measurement terminal,
    a second input which is coupled to a reference potential terminal, and
    an output which is coupled via a first feedback impedance to the first input and at which a first output voltage can be tapped off,
a second amplifier which comprises:
    a first input which is coupled to the second measurement terminal,
    a second input which is coupled to the reference potential terminal, and
    an output which is coupled via a second feedback impedance to the first input of the second amplifier and at which a second output voltage can be tapped off,
a third amplifier which comprises:
    a first input which is coupled to the third measurement terminal,
    a second input which is coupled to the reference potential terminal, and
    an output which is coupled via the third feedback impedance to the first input of the third amplifier and at which a third output voltage (Vc) can be tapped off,
and a fourth amplifier which comprises:
    a first input which is coupled to the fourth measurement terminal,
    a second input which is coupled to the reference potential terminal, and an output which is coupled via the fourth feedback impedance to the first input of the fourth amplifier and at which a fourth output voltage can be tapped off.

14. Photodetector arrangement as claimed in claim 11, in which the measuring circuit arrangement comprises a series connection of a first impedance and a diode, the series connection providing a compensation current between the output of the first amplifier and the compensation terminal.

15. Photodetector arrangement as claimed in claim 12, in which in which the measuring circuit arrangement comprises a series connection of a first impedance and a diode, the series connection providing a compensation current between the output of the first amplifier and the compensation terminal, and wherein the measuring circuit arrangement further comprises a second impedance and the output of the second amplifier is connected via the second impedance to a node between the diode and the first impedance.

* * * * *